United States Patent [19]

Lou

[11] Patent Number: 4,912,536
[45] Date of Patent: Mar. 27, 1990

[54] CHARGE ACCUMULATION AND MULTIPLICATION PHOTODETECTOR

[75] Inventor: Liang-fu Lou, Rancho Palos Verdes, Calif.

[73] Assignee: Northrop Corporation, Hawthorne, Calif.

[21] Appl. No.: 181,854

[22] Filed: Apr. 15, 1988

[51] Int. Cl.⁴ ............................................. H01L 29/78
[52] U.S. Cl. ......................................... 357/24; 357/30
[58] Field of Search .................... 357/24, 30 A, 59, 13

[56] References Cited

U.S. PATENT DOCUMENTS 4,701,773  10/1987  Kaneda et al. .................. 357/30 A Primary Examiner—William L. Sikes
Assistant Examiner—Robert E. Wise
Attorney, Agent, or Firm—Terry J. Anderson; Robert B. Block

[57] ABSTRACT

A charge accumulation and multiplication photodetector has a unit cell composed of three gates formed on a substrate. The first gate serves as a photodetector and charge integrator. The second gate serves as a transfer control gate and the third gate serves as an avalanche multiplication gate. In operation the transfer gate is closed and in response to a photon flux charge is accumulated in the first gate. After an integration time period to collect charge, the avalanche gate is biased into an avalanche ready state and the charge transfer gate is then enabled allowing for a rapid transfer of the integrated charge from the accumulator gate to the avalanche gate. The displacement current of avalanche induced charge across the avalanche gate is utilized as signal output of the device. Gain is achieved in the device in avalanching the charge in the avalanche gate and by transferring the charge across the transfer gate in a time period substantially less than integration time period to yield a current gain in the transfer process.

24 Claims, 2 Drawing Sheets

CHARGE ACCUMULATION AND MULTIPLICATION PHOTODETECTOR

BACKGROUND OF THE INVENTION

This invention is directed to a charge accumulation and multiplication photodetector capable of sensing photons, accumulating charge in response to these photons, exhibiting internal gain and output of an enhanced displacement current signal for read out corresponding to the input photon flux.

A variety of photodetecting devices are known. These are utilized to produce electrical signals in response to optical signals. These range from single photodetectors utilized in optical communications as, for instance, in association with fiber optics to complex charge couple devices utilized as scene detectors for television and other video cameras, astronomical and military applications. For optical communication systems a variety of discrete avalanche photo diodes are known which utilize an avalanche multiplication technique to amplify light signals in the optical communication system.

With the exception of a recent thesis heretofore avalanching type devices useful for scene observation were not known. For charge couple devices and other array devices amplification of a photon flux has always been achieved external of the photodetector device and is accomplished by reading the charge output from the device with amplification of this charge then effected external of the device.

In a thesis entitled Avalanche Gain In Charge Coupled Devices, submitted to the Massachusetts Institute of Technology in August of 1986, Stephanie A. Gagar suggests the incorporation of an avalanche multiplication of charge on a charge coupled device. To accomplish this charge is collected and accumulated under a gate in a potential well. The accumulated charge is then transferred through an intermediate gate to a storage gate where it is temporarily stored. The original gate wherein the charge was first accumulated is then biased into avalanching. Charge is then transferred back from the temporary holding gate to the accumulating gate which is now biased as an avalanching gate. This is accomplished by pulsing the holding gate and spilling the charge from under the intermediate gate to the avalanching region. For further gain this procedure is repeated multiple times, i.e. 10 to 250 times, to build up charge. Once sufficient charge has been built up, the charge is moved off of the CCD gates to a charge sensitive amplifier for amplification and read out.

In this device, while gain was achieved it was also accompanied by increase in noise since during each avalanche "dark current" and other spurious charge is generated, added to signal charge and amplified. The author suggested but did not demonstrate that the dark currents and other spurious charges which led to amplified noise in the device might be eliminated by utilizing the device at a lower temperatures, i.e. below the minus 80° C. temperature which the author utilized, or controlling spurious charge by changing the degree of ion implantation of channel stop regions or utilizing a fill plate for isolation.

Since all of the above described photodetection devices as well as other known photodetectors rely upon reading out charge, any device amplification as, for instance, avalanching also amplifies charges associated with noise and other spurious anomalies of the device which limits the resolution of the devices. Further, because off device amplifiers must be utilized to amplify the output charge of these devices operation of these devices is inherently more complex.

It is apparent that there is a need for new photon flux detecting devices which incorporate on device amplification and which do not rely upon read out of charge as the device output. Further, such devices should be capable of being constructed utilizing existing technology and design rules.

BRIEF DESCRIPTION OF THE INVENTION

According to this invention there is provided a device and a process for photon detection which achieves on device amplification of a photon flux within the device unit cell and which is capable of being constructed with a plurality of these unit cells to form an array for constructing an image sensor.

In accordance with this invention a simple unit cell is constructed which incorporates a first means for photon detection and charge accumulation. Associated with this first means is a charge transfer control means. Associated with the charge transfer control means is a multiplication means for providing for internal gain through a multiplication process. In response to a photon flux, charge is accumulated on the photon detection charge accumulation means and is then transferred through the charge transfer control means to the multiplication means for amplification.

In accordance with this invention output of an amplified signal from the unit cell is achieved utilizing a displacement current of the multiplication means as an output signal. This output displacement current is enhanced by providing for accumulation of the charge over a time period and then transfer of this charge to the multiplication means in a very short time yielding a parametric amplification or time compression increase in gain of the output current.

In accordance with the invention a charge accumulation multiplication photodetector is constructed having a unit cell having three gates. The first gate serves as the above referred to photodetection charge accumulation means. A second intermediate gate serves as the above referred charge transfer control means and the third gate serves as the above referred to multiplication means. By accumulating charge over a time period in response to photon flux on the first gate and then transferring this charge from the first gate to the third gate under the control of the second intermediate gate in a short period of time compared to the accumulation time, a current gain is achieved. By biasing the third gate into avalanche at the time of transfer of the charge from the first gate under the control of the second gate to the third gate the output will be amplified by the multiplication factor associated with the avalanche process and a displacement current having significant gain is available as a device output signal.

In an embodiment of the invention three MOS capacitor gates are formed in an array on a substrate as a unit cell. These gates are biased into accumulation to clear all previous stored charges on the gates. One of the gates, an intermediate gate, is maintained in accumulation while a detection and accumulation gate is biased into depletion to detect and accumulate charges. The remaining gate, a multiplication gate, is biased into an avalanche ready state. After an integration time period the intermediate gate is biased into depletion to transfer accumulated charges from the detector and accumulating gate to the multiplication gate. In the multiplication gate the accumulated charges undergo amplification by avalanche and in response to these amplified charges a displacement current output signal is generated across the muliplication gate.

Gain of this displacement current is enhanced by transferring the charges from the detection and accumulation gate to the avalanche biased multiplication gate in a rapid period of time compared to the time period for accumulation of the charges. As so constructed and operated, both an avalanche multiplication gain factor and a current gain factor are achieved in the device to enhance the operation and total gain of the device.

BRIEF DESCRIPTION OF THE DRAWINGS

This invention will be better understood when taken in conjunction with the drawings wherein.

DETAILED DESCRIPTION OF THE INVENTION

Figure 1:
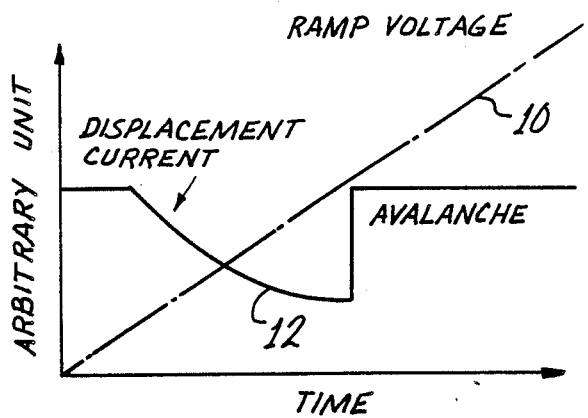
FIG. 1 is a diagram showing displacement current versus time in arbitrary units for a MOS capacitance device as biased by a ramp voltage.

In prior known charge couple devices transfer efficiency is an important operating characteristic of the device. Since the output of these devices is charge, it is important that transfer of the charge is not compromised and charge is not lost to the device. Typically a floating gate amplifier would be utilized to sense charge packets in a nondestructive manner as they pass through an amplifier. Amplified signals can be combined with a corrected time relationship to improve the signal to noise ratio. This principle is the basis of a distributed amplifier for reading charge packets. During charge transfer, integrity of the charge packet is protected by maintaining gates in an enabled state long enough to insure completed charge transfer.

Current in a device can be defined as transferring of charge per unit time. In those devices wherein transfer efficiency is important, transfer time is extended and thus the transfer of any unit of charge over an extended time period yields a relatively low current.

It is considered in most devices, charge transfer devices and photodetector devices included, that spurious current spikes or transient currents are detrimental to the device. Thus, any operation of the device wherein a transient current is produced generally is to be avoided.

With the exception of the above referred to thesis of Stephanie A. Gagar, incorporation of avalanching gates in charge couple devices has also been avoided because of the introduction of dark current and spurious charge by the avalanche gates which detracts from the integrity of the charge produced in response to a photon flux.

Contrary to both the avoidance of avalanching in image sensing devices and attempts to reduce transient device current, this invention includes both avalanching and the generation of a large displacement current. Avalanching is utilized for amplification and the generated displacement currents are utilized for device output signal. Further, the invention goes counter to prior device operation and specifically increases displacement current in the device. Since displacement current is used as output signal for the device, the increased gain of the displacement current in the invention yields improved performance in the device.

By utilizing the teaching of this invention a current gain factor which is always larger than the noise amplification factor caused from avalanche processes is achieved. The improved current gain factor of the invention results not only from an avalanche multiplication factor but also from a parametric gain of time compression. The parametric gain is obtained by integrating photo charges in an accumulation gate for longer time and transferring them to an avalanche gate in a shorter time. There is no noise related to this externally controllable time factor; however, there is current gain and as a result an improvement in signal-to-noise ratio for the invention.

A simple MOS capacitor can be constructed by locating an insulative oxide layer between a metal gate and a semiconductor as, for instance p-type Si. If a bias is applied to the metal gate then the oxide and the semiconductor behave as capacitors which are in series. The oxide exhibits fixed capacitance and the semiconductor exhibits variable capacitance as the voltage changes. As charge builds up in the semiconductor the thickness of the space charge region changes to vary the capacitance of the semiconductor.

If a capacitor is subjected to a ramp voltage as is shown in FIG. 1 when the voltage begins to rise, current jumps to a constant flatband value as long as the device is in accumulation. This displacement current in accumulation is simply $C_{ox}dV/dt$. With continued increase of the ramp voltage the displacement current decreases because the Si semiconductor starts to deplete for voltages larger than the flatband voltage. In depletion the total capacitance is the series capacitance of the oxide capacitance and the silicon capacitance. This is inversely proportional to the square root of the applied voltage. Thus the displacement current $CdV/dt$ is therefore smaller. Because of the fast ramp rate thermal generation is not significant enough to shield the Si effectively and the Si layer is driven into very deep depletion. At a particular voltage bias the device goes into avalanche and current increases to an avalanche plateau.

Initially when the device is subjected to a ramp voltage there will be a very sharp current increase which will spike and then drop to an avalanche plateau level. After burn in of the device by multiple ramping, upon each voltage ramp the current will increase to the avalanche current plateau level.

In FIG. 1 as the ramp voltage 10 increases, after the flatband voltage is passed the displacement current 12 first decreases and then sharply increases to the avalanche plateau.

It has been found that if a light pulse is impinged upon the device while the device is in the steady state avalanche condition a large photocurrent response 14 is seen in the displacement current. Heretofore in charge couple devices and other related devices such a transient photocurrent response would have been considered detrimental to the device and would have been avoided. Advantage can be taken however, of this photocurrent response.

Figure 2:
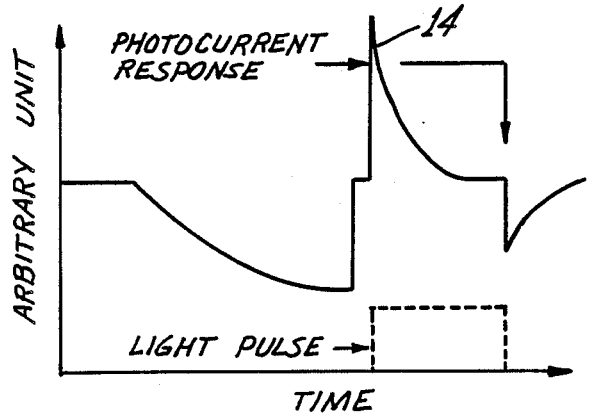
FIG. 2 is a diagram similar to FIG. 1 showing the effects of a light pulse on this device.

By utilizing a ramping technique a variable capacitor is created in the ramped gate. As the ramping voltage increases the charge on the gate increases up to a point wherein the field in the semiconductor becomes so large that the semiconductor goes through an avalanche breakdown. When avalanche breakdown occurs free carriers are generated and the space charge region or depletion region collapses and the capacitance becomes very large. If carriers are now added to the device as, for instance the photocurrent response 14 of FIG. 2, there is a large device response to the added carriers.

By constructing a charge accumulation and multiplication photodetector with the unit cell having three contiguous gates, one gate can serve as an avalanche amplifier and advantage can be taken of the large displacement current response achieved when additional carriers are added to this avalanche gate. FIG. 3 shows a representational view (not in scale) of a device of the invention constructed to have three adjacent gates in a unit cell.

Figure 3A:
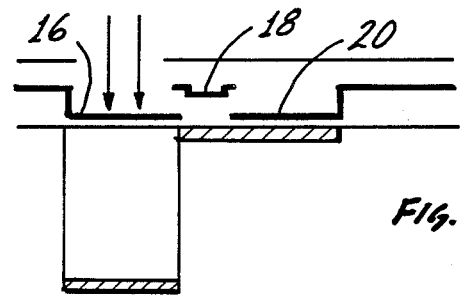
FIGS. 3A, 3B and 3C are diagrams, not in scale, showing the operation of the device of the invention.

In the device of FIG. 3 in FIG. 3A a first gate 16 is utilized as a photon detection and charge accumulator. In response to a photon flux, charges are generated in the gate 16 as shown utilizing typical charge coupling device potential well schematic representation. The second gate, gate 18 is utilized to control charge transfer. It controls the transfer of accumulated charge from gate 16 to the third gate, gate 20, the avalanche multiplication gate. The avalanche multiplication gate 20 is utilized to provide one component of the internal gain of the device whereas the time of transfer between the gates 16 and 20 under the control of the transfer gate 18 provides a further component of the gain of the device.

Figure 3B:
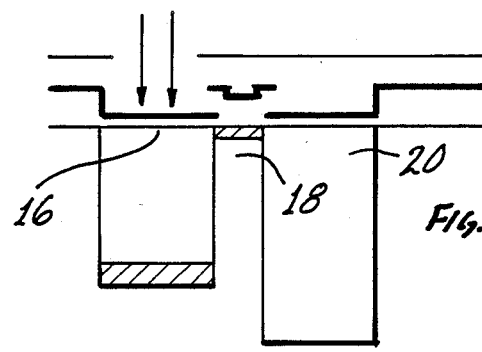
Figure 3C:
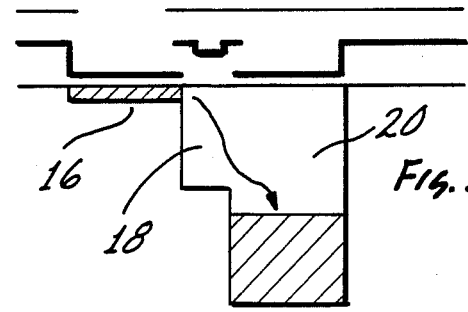

The device of FIG. 3 is operated by maintaining the gate 18 closed during impingement of a photon flux on the gate 16 and accumulation or integration of the resulting charge in the potential well of the gate 16. At a point in the timing sequence the gate 20 is biased into an avalanche ready state. FIG. 3B depicts this process as integration is continued in the gate 16 and the gate 20 is put into the avalanche ready state. With gate 20 in an avalanche ready state the gate 18 is then opened allowing charge to move from the gate 16 to the gate 20. FIG. 3C depicts the process wherein the gate 18 is open allowing charge to flow from the potential well of gate 16 to the potential well of gate 20 and undergo avalanche multiplication in the gate 20.

The time dependent avalanche current generated in the gate 20 generates a displacement current in the external circuit of the gate 20. Thus, the amplified charge first accumulated in the gate 16 and multiplied in the gate 20 can be read out as the displacement current in the external circuit of the gate 20.

The device of FIG. 3 will exhibit a first gain, the avalanche gain achieved by avalanching the accumulated charge of the gate 16 in the avalanche multiplication gate 20 in a short time. This avalanche gain is not available in current CID or CCD or photovoltaic focal plain arrays. Thus, the device and process of the invention yields an added sensitivity advantage over current photo devices and processes. This added sensitivity of the unit cell of the invention is reflected as an overall sensitivity increase in a sensing device constructed by utilizing a plurality these unit cells.

The gates 18 and 20 of FIG. 3 can be formed as three adjacent MOS capacitors located on a suitable semiconductor substrate such as p+ Si. To operate this device all three of the MOS capacitors, the gates 16, 18 and 20 are biased into accumulation to clear all previously stored charges. The photodetector, gate 16 is biased into deep depletion to detect photons and to accumulate charge. During this time the isolation or transfer gate 18 remains closed in the accumulation mode.

After a sufficient time period for integration of charge in the gate 16 the avalanche multiplication gate 20 is biased into avalanche. This can be done by ramping a voltage onto the gate 20. After bias into avalanche when the avalanche multiplication gate 20 is in an avalanche ready state, the charge transfer gate 18 is opened by biasing it into a depletion mode. The accumulated charge generated from the photon flux on gate 16 can therefore be transferred across the charge transfer gate 18 to the avalanche photo multiplication gate 20 wherein it undergoes amplification by multiplication factor associated with the avalanche process and is then available for read out as a displacement current in the external circuit of the gate 20.

The above process is enhanced by constructing and/or operating the charge transfer gate 18 in a manner whereby the charge from the photodetection and charge accumulating gate 16 is transferred to the avalanche multiplication gate 20 very fast. Since the same unit charge which was accumulated over a long period of time in the photodetection and charge accumulator gate is now transferred in a very short period of time across the charge transfer gate to the avalanche multiplication gate there is a further current gain, a parametric gain, in the displacement current. The device and process of the invention thus achieves gain from both the current gain based on the time compression of the transfer process and the avalanche gain based on the multiplication factor of the charge avalanching.

The overall gain of a device of this invention can be expressed as:

$$\frac{i_{\text{out}}}{i_{\text{in}}} = M\left(\frac{t_o}{t_t}\right)$$

As is evident from the above formula, the output current $i_{out}$ from the avalanche gate with respect to the optical current $i_{in}$ in the detector gate is approximately equal to the avalanche multiplication factor M times the integration time $t_o$ of charge accumulation in the photodetector gate divided by the transfer time $t_t$ across the transfer gate. Thus the gain of the output displacement current is proportional both to the multiplication factor of the avalanche process and the integration time divided by the transfer time. The multiplication factor is indicative of the characteristics of the avalanche multiplication gate and the integration time divided by the transfer time is indicative of the characteristics of the charge transfer, determined by all three gates.

Because the devices and processes of the invention can incorporate two gain factors it is possible to utilize one or the other of these gain factors to construct tunable devices or to effect the processes as a tunable processes. This will be better understood in reference to FIG. 4 which shows a timing diagram of a device of the invention.

At time $t_1$ the transfer gate and avalanche gate are biased into accumulation to clear previous stored charges and the detector gate is biased to depletion to detect photons and accumulate charge response to the detected photon flux. The transfer gate remains in the accumulation mode. At time $t_2$ positive ramp of the avalanche gate is initiated and the voltage bias across the avalanche gate starts to increase.

At time $t_4$ the detector gate is driven into accumulation and the transfer gate into depletion to open or enable the transfer gate allowing for charge to transfer across the transfer gate to the avalanche gate. At this time, time $t_4$, the avalanche gate is in an avalanche ready state shown at phantom line 22 and the device exhibits a time dependent avalanche current which is read out on the external circuit of the avalanche gate as a displacement current signal. This displacement current signal is indicative of the amount of charge accumulated in the detector gate in response to the photon flux experienced by the detector gate while the detector gate was enabled.

If the timing sequence was modified and the transfer gate opened and the detector gate closed at time $t_3$ instead of time $t_4$ it is evident that at time $t_3$ the ramp voltage in the avalanche gate is lower at phantom line 24 then it is at time $t_4$ at phantom line 22. Since the avalanche ramp voltage at time $t_3$ is different than the avalanche ramp voltage at time $t_4$ the avalanche multiplication factor and thus the avalanche gain of the avalanche gate is also different.

At time $t_3$ the overall gain may be as, for instance, $10^6$ whereas at time $t_4$ it may be $10^{10}$. In changing from the time $t_3$ to even an earlier time, the gain factor will change even further. A gain factor between 1 and $10^{10}$ can thus be selected. This allows tuning of the device to compensated for photon flux and other similar parameters.

Figure 4A:
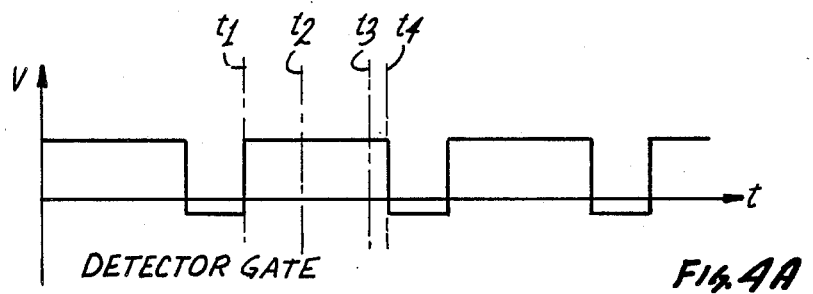
FIGS. 4A, 4B, 4C and 4D are timing diagrams of arbitrary scale showing operation of a device of the invention.
Figure 4B:
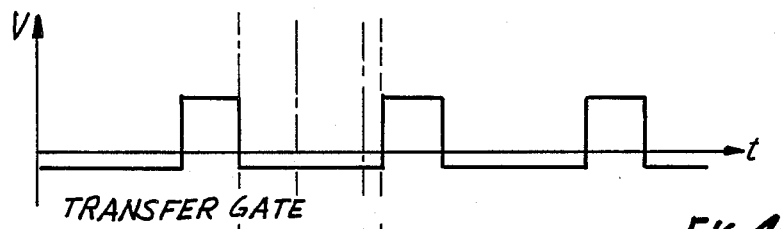
Figure 4C:
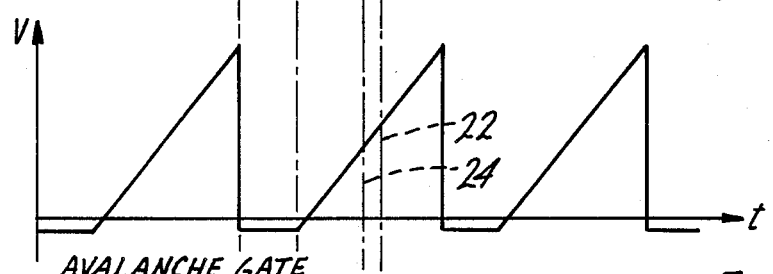
Figure 4D:
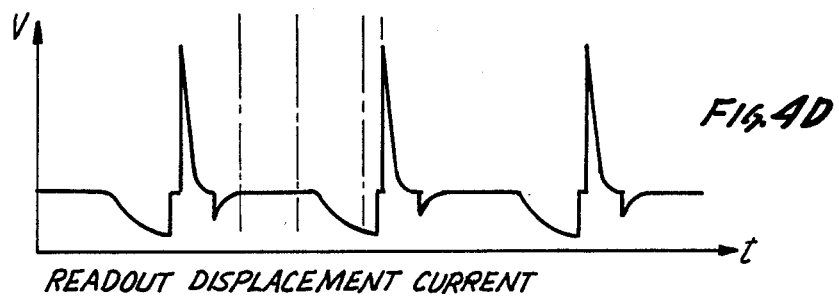

Ramping of the avalanche gate can be conducted to plateau the ramp voltage to a value below that wherein maximum avalanche gain is achieved as, for instance plateaus corresponding to phantom lines 22 or 24 of FIG. 4C. The ramp voltage may be increased to a plateau voltage and then leveled off at the plateau voltage prior to decrease of the ramp voltage. The maximum amplification gain of such a "plateau" device is therefore limited to the plateau ramp voltage. In certain instances as, for instance with high photon flux, maximum amplification gain may not be desirable and the voltage ramp may be terminated at a plateau and held there prior to the drop of voltage during the ramp. Further advantages in device stability, device lifetime and lower noise are gained by ramping the voltage to a value less than the maximum multiplication gain.

Figure 5:
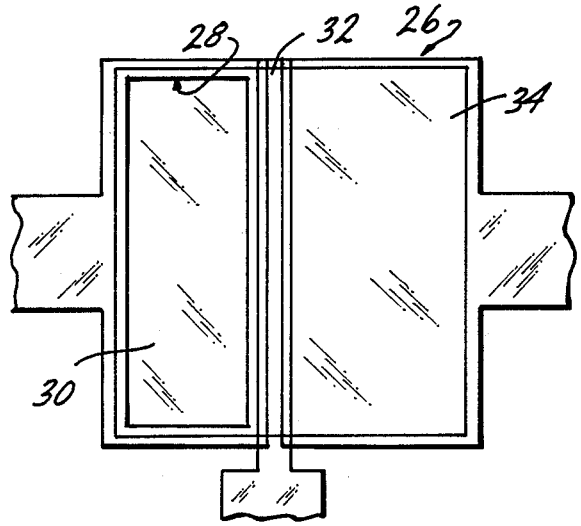
FIG. 5 is a plan view of a typical unit cell of a device of the invention.

FIG. 5 shows a typical construction of a device 26 of the invention. The device 26 represents a unit cell of a charge accumulation and multiplication photodetector. It is formed as three MOS capacitor gates in a normal manner on a suitable semiconductor substrate as for instance a silicon substrate. The gates would be formed with typical CCD gate overlap utilizing silicon oxide as an insulator and polysilicon for gate formation. The leads are metallized with aluminum and a window is provided over the photodetector and charge accumulator gate. Thus, in the device 26 the window 28 exposes the photodetector and charge accumulator gate 30 to a photon flux.

A very narrow charge transfer gate 32 is located in between the photodetector and charge accumulator gate 30 and an avalanche multiplication gate 34. Utilizing typical MOS capacitor construction the gates are formed as overlapping gates as is seen in the schematic representation of FIG. 3.

In forming the transfer gate 32 as a very narrow gate between the two larger gates 30 and 34 it is sized and shaped such that transfer time across the gate 32 between the gates 28 and 32 is very rapid. Transfer time typically can be on the order of 0.10 to 10 microseconds utilizing normal silicon technology. If integration time during accumulation of charge on the photodetector and charge accumulator gate 30 is of the order of about 5 milliseconds then with a transfer time on the order of about 5 microseconds a $10^3$ gain factor in charge transfer is achieved across the charge transfer gate 32.

If the ramp rate of the voltage on the avalanche gate is chosen to achieve a multiplication factor of $10^4$ with a current gain across the transfer gate of $10^2$ then overall output signal gain, gain of the displacement current across the avalanche multiplication gate 34, will be of the order of $10^6$.

Further, by construction the device 26 such that the charge transfer gate 32 is of a size domain smaller than the size domain of the photodetection and accumulating gate 30, not only is there a gain factor in the displacement current, but also this assures that the avalanche multiplication gate 34 receives a photo charge in a short period of time whereby a gain in the signal-to-noise ratio over a conventional avalanche photodiode is achieved.

For detection of a very weak photon flux the device 26 might be constructed to have even a higher current gain across the charge transfer gate 32 as, for instance $10^4$ and a higher ramp voltage so as to increase the avalanche multiplication gain as, for instance to $10^6$ to yield an overall gain of $10^{10}$ for the device. In other situations wherein the photon flux is stronger, lower amplifications may be desirable.

Typically the device 26 of FIG. 5 could be constructed of a variety of sizes as, for instance, having a unit cell dimension of $27 \times 25$ micrometers with a detector width of 10 micrometers, a transfer gate width of 5 micrometers and an avalanche gate width of 12 micrometers. The detector gate would be exposed under a window of about $4 \times 21$ micrometers with a gate overlap of about 2 micrometers between the transfer and the detector and avalanche gates. It is evident that other sized unit cells could also be constructed as for instance a $50 \times 50$ micrometer unit cell with detector, transfer and avalanche gate widths of 20, 5 and 25 micrometers respectively or a $460 \times 500$ micrometers unit cell with detector, transfer and avalanche gate widths of 200, 10 and 200 respectively.

Unit cells or unit cells arrayed as a scene detector or scanner are constructed utilizing typical MOS silicon technology utilizing photolithographic masks for silicon etch, field oxide growth, window opening in the active area, active region oxide growth, lower polysilicon gate disposition, thick oxide deposition and upper polysilicon gate deposition as are known in the art.

Depending upon the wave length of the photon flux which is scanned, other materials other than silicon might be utilized. These would include group III-IV materials as, for instance binary gallium arsenide, ternary gallim arsenide (gallium aluminum arsenide or the like) or indium antimony, group II-VI materials as, for instance, lead tin telluride, or mercury cadmium telluride. Indium antimony is particularly useful for wave lengths of 3 microns to 5 microns, mercury cadmium telluride is useful from short IR to long IR, i.e. from 1 micron up to 12 microns and silicon is particularly useful for visible light.

Compared to other scanning devices for receiving a photon flux since the device and process of the invention do not require read out of charge from the device, while it would be very advantageous, it is not necessary that the device or process of the invention operate near 100% efficiency. Since the device and process of the invention achieves internal amplification within the device itself and since current across the avalanche gate is utilized as the output signal of the device, this allows for operation of the device at less than 100% efficiency and for greater manufacturing tolerances during manufacturing of the device of the invention. Further because the device of the invention can be tuned it can be utilized in a variety of situations to detect photons of varying wave lengths and photodensities.

This invention has been described in conjunction with the illustrative embodiments enumerated above. It would be evident to the art skilled that various alterations, modifications and variations may be made to the illustrative embodiments without departing from the spirit and scope of the claims appended hereto. In view of this, this invention is not to be construed as being limited to only the illustrative embodiments, but should only be construed in view of the appended claims.

What is claimed is:

1. A charge accumulation and multiplication photodetector which comprises:
   a semi-conductor substrate;
   a photodetection-charge accumulation means for detecting photons and accumulating charges in response to said detected photons, said photodetection-charge accumulation means located on said substrate;
   an avalanche multiplication means for providing an internal gain through avalanche multiplication of charge transferred to it, said avalanche multiplication means located on said substrate; and
   a charge transfer control means for controlling the transfer of charge between said photodetection-charge accumulation means and said avalanche multiplication means, said charge transfer control means located on said substrate between said photodetection-charge accumulation means and said avalanche multiplication means.

2. A charge accumulation and multiplication photodetector of claim 1 wherein:
   each of said photodetection-charge accumulation means, said avalanche multiplication means and said charge transfer control means comprises a MOS device located on said substrate.

3. A charge accumulation and multiplication photodetector of claim 2 wherein:
   said MOS devices comprise MOS capacitor gates.

4. A charge accumulation and multiplication photodetector of claim 1 wherein:
   said photodetection-charge accumulation means comprises a first MOS gate of a first size domain on said substrate;
   said charge transfer control means comprises a second MOS gate of a second size domain on said substrate;
   said avalanche multiplication means comprises a third MOS gate on said substrate; and
   said second MOS gate positioned between said first and third MOS gates and of a size domain less than the size domain of said first MOS gate to effectively transfer charges from said first gate to said third gate in a time period less than the time period wherein charge is accumulated on said first MOS gate whereby a displacement current gain is achieved in transferring charges from said first gate to said third gate.

5. A charge accumulation and multiplication photodector of claim 1 wherein:
   said semi-conductor substrate is a material selected from the group of materials consisting of silicon, binary gallium aresenide, ternary gallium arsenide, indium antimony, lead tin telluride and mercury cadmium telluride.

6. A charge accumulation and multiplication photodetector which comprises:
   a semi-conductor substrate;
   a photodetector and integrator means for detecting photons and storing charges during a first time frame, said photodetector and integrator means located on said substrate;
   a transfer means for controlling and effecting the transfer of charge from said photodetector and integrator means during a second time frame, said transfer means located on said substrate in association with said photodetector and integrator means; and
   charge multiplier and displacement current output means for multiplying charge and outputing a displacement current in response to said multiplied charge, said charge multiplier and displacement current output means located on said substrate in association with said transfer means to receive charge transferred from said transfer means with said transfer means positioned between said charge multiplier and displacement current output means and said photodetector and integrator means.

7. A charge accumulation and multiplication photodetector of claim 6 wherein:
   said second time frame representing current transfer and is smaller than said first time frame representing current integration so that there is a displacement current gain in moving charge across said transfer means from said photodetector and integrator means to said charge multiplier and displacement current output means.

8. A charge accumulation and multiplication photodetector of claim 6 wherein:
   said charge multiplier and displacement current output means includes charge avalanching means for avalanching charge transferred to said charge multiplier and displacement current output means whereby there is an avalanche multiplication gain in moving charge to said charge multiplier and displacement current output means.

9. A charge accumulation and multiplication photodetector of claim 6 including:
   first and second gain means for increasing the output of said device;
   said first gain means comprising said second time frame being smaller than said first time frame to yield a displacement current gain in moving charge across said transfer means from said photon detector and integrator means to said charge multiplier and displacement current output means; and
   said second gain means comprising said charge multiplier and displacement current output means including charge avalanching means for avalanching charge transferred to said charge multiplier and displacement current output means to yield an avalanche multiplication gain in moving charge to said charge multiplier and displacement current output means.

10. A charge accumulation and multiplication photodetector which comprises:
a semi-conductor substrate;
a MOS photon detector integrator gate located on said substrate;
a MOS avalanche multiplication gate, said MOS avalanche multiplication gate independent and distinct from said photon detector integrator gate, said MOS avalanche multiplication gate located on said substrate; and
a MOS charge transfer gate located on said substrate between said photon detector integrator gate and said avalanche multiplication gate, said charge transfer gate controlling the transfer of charge from said detector integrator gate to said avalanche multiplication gate.

11. A charge accumulation and multiplication photodetector of claim 10 wherein:
said transfer gate is narrower than said detector integrator gate to shorten the time of transfer of said charge from said detector integrator gate to said avalanche multiplication gate.

12. A process of detecting photons which comprises:
associating a charge transfer control gate between a photodetection-charge accumulation gate and a multiplication gate on a substrate;
operating said charge transfer control gate in a first mode to inhibit transfer of charge from said photodetection-charge accumulation gate to said multiplication gate;
collecting charge in said photodetection-charge accumulation gate in response to receipt of photons by said photodetection-charge accumulation gate;
operating said multiplication gate in a multiplication mode; and
operating said charge transfer control gate in a further mode to transfer the charge collected in said photodetection-charge accumulation gate from said photodetection-charge accumulation gate to said multiplication gate.

13. A process of detecting photons of claim 12 including:
measuring a displacement current of said multiplication gate as an indication of the number of said photons collected by said photodetection-charge accumulation gate.

14. A process of detecting photons of claim 12 which comprises:
operating said charge transfer control gate in said first mode for a time period to collect charge in said photodetection-charge accumulation gate; and
operating said charge transfer control gate in said further mode to transfer said charge to said multiplication gate in an abbreviated time period compared to said collection time period.

15. A process of detecting photons of claim 12 including:
operating said multiplication gate as an avalanche gate;
increasing the gain of said collected charges by avalanching said collected charges and measuring the resulting avalanched charge as a displacement current gain.

16. A process of detecting photons of claim 12 including:

imposing a ramp voltage on said multiplication gate as said charge transfer gate is switched from operation in said first mode to operation in said second mode.

17. A process of detecting photons of claim 12 including:
imposing a ramp voltage on said multiplication gate as said charge transfer gate is switched from operation in said first mode to operation in said second mode to place said multiplication gate in an avalanche ready state;
operating said charge transfer control gate in said further mode to transfer collected charge from said photodetection-charge accumulation gate to said multiplication gate while said multiplication gate is in said avalanche ready state to avalanche said transferred charge to introduce an avalanche gain; and
detecting said avalanche gain as an output displacement current of said multiplication gate.

18. A process of detecting photons of claim 17 including:
operating said charge transfer control gate in said first mode for a time period to collect charge in said photodetection-charge accumulation gate;
operating said charge transfer control gate in said further mode to transfer said charge to said multiplication gate in an abbreviated time period compared to said collection time period to introduce a further gain in said displacement output current of said multiplication gate.

19. A process of detecting photons which comprises:
locating a first gate, a second gate and a third gate in an array on a substrate;
detecting photons as charge on said first gate and integrating said charge on said first gate by holding said charge on said first gate with said second gate;
ramping a voltage on said third gate to place said third gate in an avalanche ready state;
enabling said second gate during said third gate ramp to transfer said integrated charge to said third gate and avalanche said transferred charge in the third gate; and
reading an output displacement current from said third gate indicative of said avalanched transferred charge.

20. A process of detecting photons of claim 19 including:
enabling said second gate to transfer the integrated charge from said first gate to said third gate in a time period less that the time period of said integration of said charge on said first gate to introduce a gain in said output displacement current.

21. A process of detecting photons of claim 19 including:
tuning said output displacement current by varying the rate of ramping of said third gate to vary the avalanche gain of said third gate.

22. A process of charge accumulation and multiplication in a photodetector which comprises:
locating first, second and third MOS capacitor gates in an array on a substrate;
biasing said first, second and third gates into accumulation to clear all previous stored charges;
maintaining said second gate in accumulation while biasing said first gate into deep depletion to detect and accumulate charges on said first gate;
biasing said third gate into an avalanche ready state;

biasing said second gate into depletion to transfer accumulated charges from said first gate to said third gate and amplify said transferred charges by an avalanche multiplication factor in said third gate; and reading out a displacement current from said third gate as an indicator of said accumulated amplified charges.

23. A process of charge accumulation and multiplication in a photodetector of claim 22 including:
biasing said third gate into said avalanche ready state by ramping a voltage on said third gate.

24. A process of charge accumulation and multiplication in a photodetector of claim 23 including:
tuning said photodetector by varying the ramp rate of said bias voltage on said third gate.

* * * * *